(12) United States Patent
Kamiya et al.

(10) Patent No.: US 6,888,723 B2
(45) Date of Patent: May 3, 2005

(54) LED LAMP APPARATUS

(75) Inventors: Takayuki Kamiya, Aichi-ken (JP); Kazushi Noda, Aichi-ken (JP); Mitsuhiro Nawashiro, Aichi-ken (JP); Hiroshi Ito, Aichi-ken (JP); Akihiro Misawa, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/326,277

(22) Filed: Dec. 23, 2002

(65) Prior Publication Data

US 2003/0133302 A1 Jul. 17, 2003

(30) Foreign Application Priority Data

Dec. 26, 2001 (JP) ........................................ 2001-393578

(51) Int. Cl.$^7$ ................................................. H05K 7/20
(52) U.S. Cl. ....................... 361/715; 361/778; 361/545; 361/773; 362/245
(58) Field of Search ................................. 361/715, 777, 361/776, 768, 773, 778, 774, 247, 545, 231; 439/57, 620; 313/318.1; 362/80, 373, 247, 545, 231, 487, 346, 517, 245

(56) References Cited

U.S. PATENT DOCUMENTS

| 4,449,778 | A | * | 5/1984 | Lane ........................... 439/610 |
| 4,935,665 | A | * | 6/1990 | Murata ........................ 313/500 |
| 5,062,818 | A | * | 11/1991 | Wasimoto et al. ............. 445/22 |
| 5,378,158 | A | * | 1/1995 | Owen et al. .................. 439/57 |
| 5,746,497 | A | * | 5/1998 | Machida ...................... 362/496 |
| 6,411,022 | B1 | * | 6/2002 | Machida .................. 313/318.1 |
| 6,474,852 | B1 | * | 11/2002 | Ohkohdo et al. ........... 362/487 |
| 6,682,211 | B2 | * | 1/2004 | English et al. .............. 362/545 |

FOREIGN PATENT DOCUMENTS

| JP | 03-113857 | 11/1991 |
| JP | 06-21085 | 3/1994 |

* cited by examiner

*Primary Examiner*—Kamand Cuneo
*Assistant Examiner*—Hung S. Bui
(74) *Attorney, Agent, or Firm*—McGinn & Gibb, PLLC

(57) ABSTRACT

An LED lamp apparatus comprises LED, a circuit member, and a case member. The case member has an LED seat for holding the LED. The circuit member has metal plates embedded in the case member. The metal plates have LED connection members exposed from the case member. The LED connection members have been resistance welded respectively to leads of the LED.

26 Claims, 6 Drawing Sheets

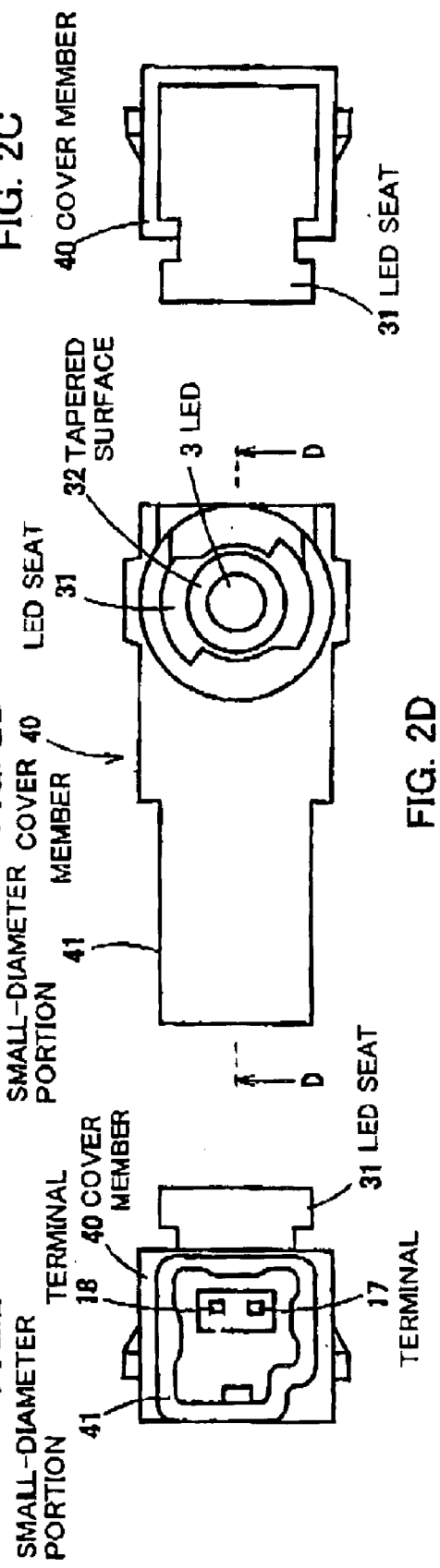
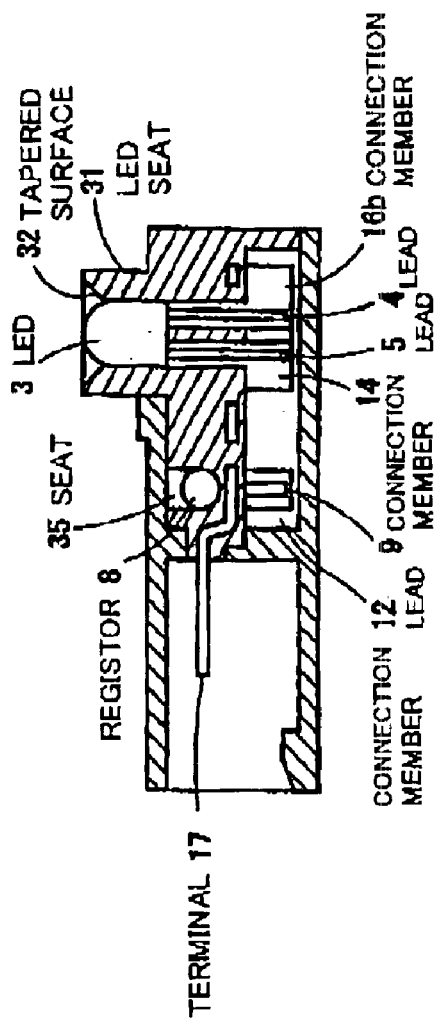

LED LAMP APPARATUS

The present application is based on Japanese Patent Application No. 2001-393578, the entire contents of which are incorporated herein by reference.

BACKGROUND OF THE INVENTION

1. Field of the Invention

This invention relates to an LED lamp apparatus,

2. Related Art

Shell-shaped or SMD (surface mount device) LEDs have hitherto been known. When the use of these LEDs, for example, as a lamp for a vehicle is contemplated, leads of LED are solder attached to a printed board. This board is then fitted into a case member to constitute an LED lamp apparatus which is then mounted on the vehicle in its predetermined position. The printed board is wired in an illumination control unit in the vehicle, whereby brightness during blinking of LED and brightness during lighting of LED are controlled by a switch or a control circuit in the vehicle.

In the conventional LED lamp apparatus, since the printed board, on which LED is mounted, is formed of a resin, the dissipation of heat generated from LED is sometimes unsatisfactory. Further, since LED and an element constituting its power supply circuit are solder attached to the printed board formed of resin, in some cases, heat at the time of solder attachment causes fatigue of or damage to the printed board.

SUMMARY OF THE INVENTION

The invention has been made with a view to solving the above problems of the prior art, and the constitution of the invention is as follows.

Specifically, according to the invention, there is provided an LED lamp apparatus comprising an LED, a circuit member, and a case member, said case member having an LED seat for holding said LED, said circuit member having metal plates embedded in the case member, said metal plates having LED connection members exposed from the case member, said LED connection members being electrically connected respectively to leads of the LED.

According to the LED lamp apparatus having the above construction, the circuit member comprises metal plates. Leads of LED are connected to LED connection members of the respective metal plates. Therefore, the heat generated from the LED can be efficiently released to the metal plates. This renders LED in the LED lamp apparatus of the invention highly reliable. Further, since the metal plates have better heat dissipation properties than the printed board, the adoption of metal plates in the circuit member can eliminate the fear of the metal plates (circuit member) being damaged even upon the application of heat to the circuit member at the time of joining of the circuit to the leads of the LED. By virtue of this, in the LED lamp apparatus of the invention, the production yield can be improved, and, consequently, the LED lamp apparatus can be provided at a low price. Further, there is no need to use any printed board. This can reduce the necessary number of components and thus can reduce the cost.

BRIEF DESCRIPTION OF THE DRAWINGS

The invention will be explained in more detail in conjunction with the appended drawings, wherein:

FIG. 2A is a left side view showing the LED lamp apparatus shown in FIG. 1;

FIG. 2B is a plan view showing the LED lamp apparatus shown in FIG. 1;

FIG. 2C is a right side view showing the LED lamp apparatus shown in FIG. 1;

FIG. 2D is a cross-sectional view taken on line D—D of FIG. 2B.

DESCRIPTION OF THE PREFERRED EMBODIMENTS

The invention will be explained in detail in conjunction with the following embodiments.

Figure 1:
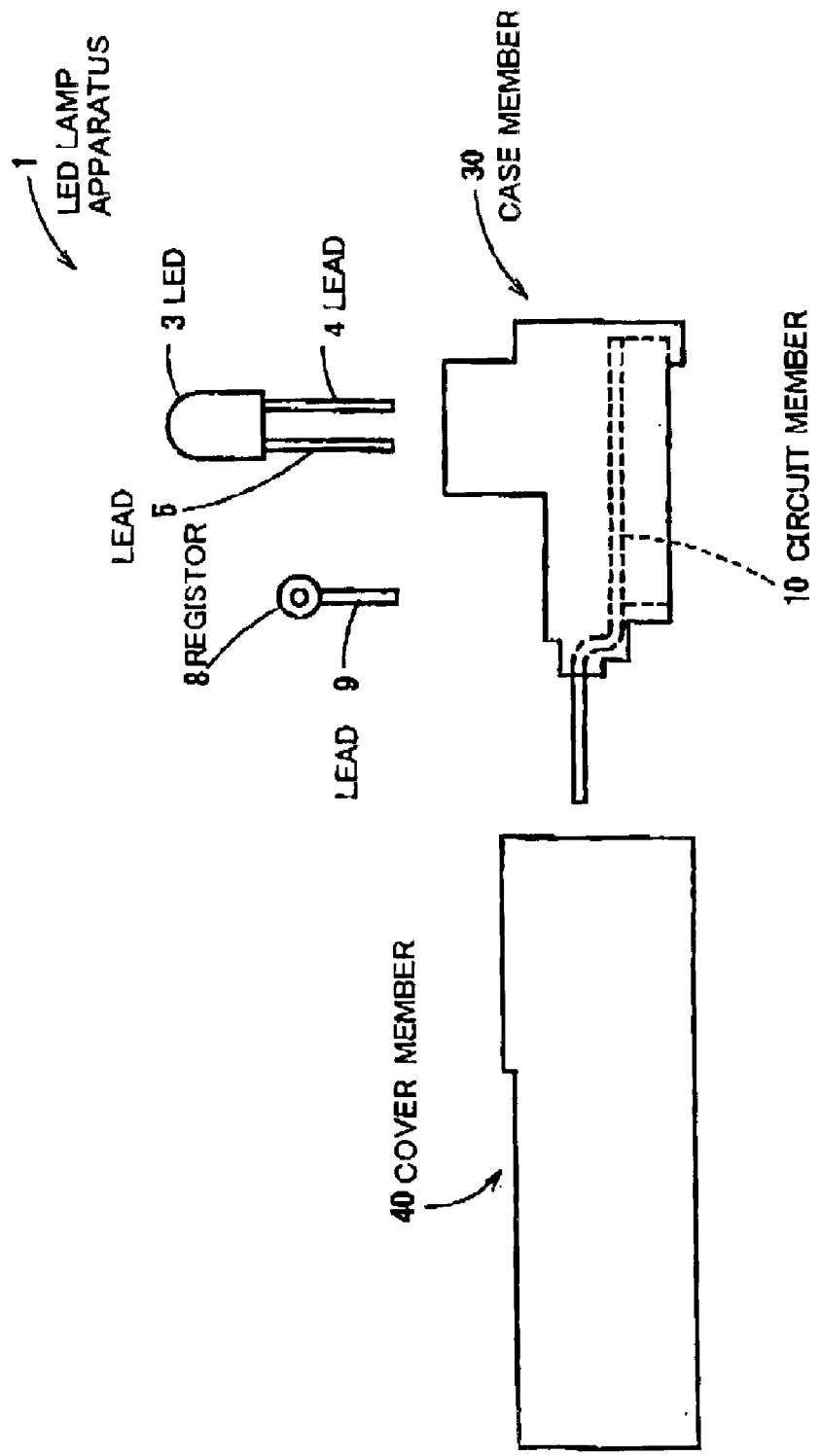
FIG. 1 is an exploded view of an LED lamp apparatus in an embodiment of the invention.

FIG. 1 is an exploded side view of an LED lamp apparatus 1 according to the invention. As shown in this drawing, the LED lamp apparatus 1 includes LED 3, a circuit member 10, a case member 30, and a cover member 40.

LED 3 is a shell-shaped LED. In this embodiment, the light emitting device within LED 3 is a blue light emitting diode formed of a group III nitride compound semiconductor. LED 3 comprises leads 4, 5.

LED is a light source which is low in power consumption and heating value and has long service life and thus is suitable for continuous lighting for a long period of time.

The type of LED used in the LED light source is not particularly limited, and, in addition to shell-shaped type, various other types including chip types may be adopted.

Colors of light emitted from the LED light source are also not particularly limited. In addition to blue light emitting LED in the above embodiment, for example, LEDs having emission wavelengths in the visible region of white, red, orange, green, etc. can be adopted. Further, LEDs having emission wavelengths in the ultraviolet region may also be used. In this case, a phosphor, which generates fluorescence upon exposure to light in the ultraviolet region, may be used in combination with LED. The fluorescence can also be utilized as illumination light. The phosphor may be contained, for example, in a cover (a shell-shaped portion) installed on the light release side of LED. Alternatively, a phosphor-containing layer may be provided on the surface of the cover.

Further, a combination of LEDs, which are different from each other in type and/or emitting light color, may also be used.

In the drawing, numeral 8 represents a resistor as a resistance element.

Figure 3A:
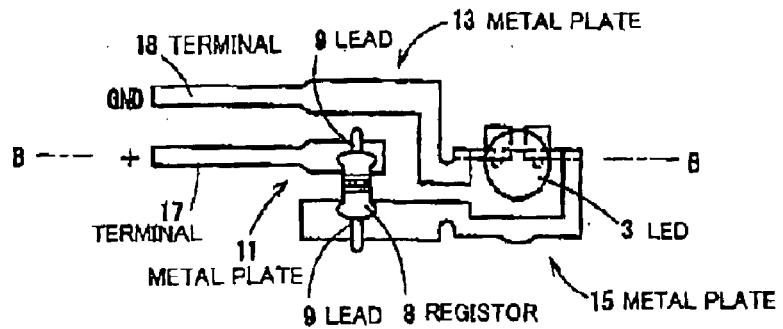
FIG. 3A is a plan view showing metal plates constituting a circuit member, and LED and various circuit elements mounted on the metal plates.
Figure 3B:
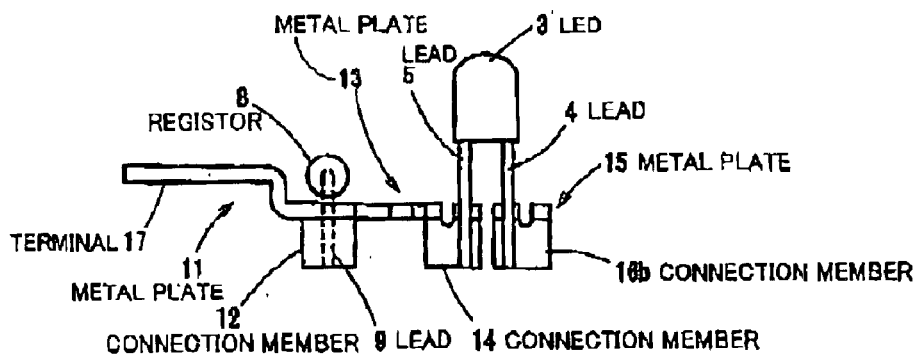
FIG. 3B is a cross-sectional view taken on line B—B of FIG. 3A.
Figure 3C:
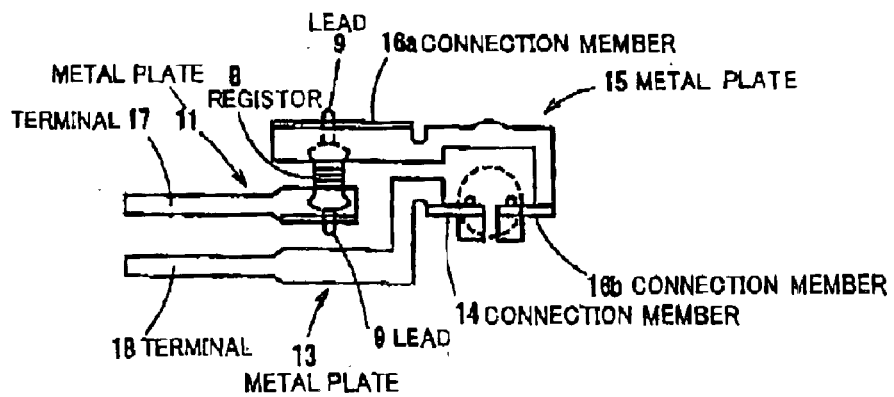
FIG. 3C is a bottom view showing metal plates constituting a circuit member, and LED and various circuit elements mounted on the metal plates.
Figure 4:
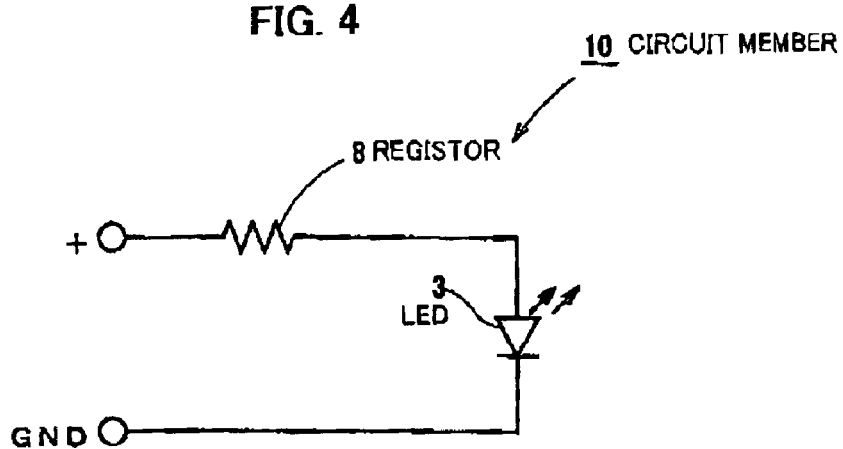
FIG. 4 is a circuit diagram showing a circuit member in an LED lamp apparatus.

As shown in FIG. 3, the circuit member 10 includes three metal plates 11, 13, 15 which constitute a circuit shown in FIG. 4.

The first metal plate 11 includes a connection member 12 for a lead 9 of a resistor 8 and a terminal 17 on + side. The second metal plate 13 includes a connection member 14 for a lead 5 of LED and a terminal 18 on grounding side. The third metal plate 15 includes a connection member 16*a* for another lead 9 of the register 8 and a connection member 16*b* for a lead 4 of LED.

In these metal plates, as shown in FIG. 2D, each of the connection members 12, 14, 16 are exposed from the case member 30. The connection members 12, 14, 16 and the respective corresponding leads 4, 5, 9 are resistance welded to each other. At that time, heat is applied to the metal plates. Unlike the prior art example using the resin printed board, however, the metal plates hardly undergo the influence of heat.

The method for joining the connection members to the leads is not limited to the resistance welding, and, for example, soldering or laser welding may be adopted.

Preferably, the connection members are exposed from the surface of the case member 30 in an identical direction (the direction of an identical side face). The reason for this is to facilitate joining of the connection members to the leads.

These metal plates 11, 13, 15 may be produced by subjecting an electrically conductive metal, such as copper, to punching and bending. A steel plate plated with copper or tin may also be used as the metal plate material.

The case member 30 is produced by injection molding a resin material using the metal plates 11, 13, 15 as inserts. In this embodiment, PBT is used as a molding material for the case member 30. The molding material, however, is not limited to PBT only, and, for example, PP, PE, ABS and other general-purpose resins, biodegradable resins (bioplastics), such as polylactic acid, and ceramics may also be used.

Figure 5A:
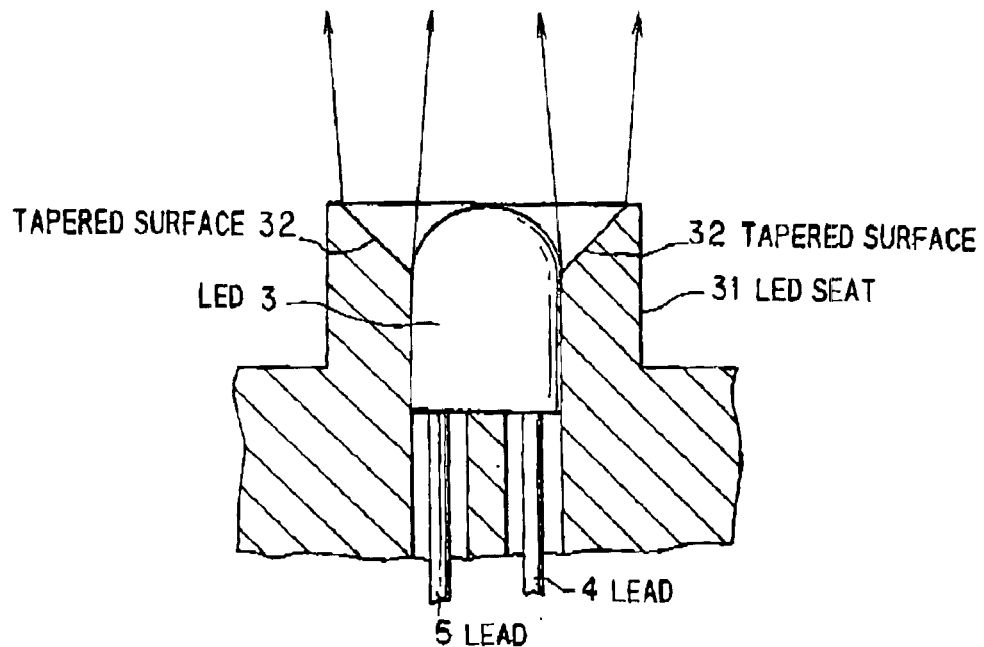
FIG. 5A is an enlarged cross-sectional view showing an LED seat in an embodiment of the invention.
Figure 5B:
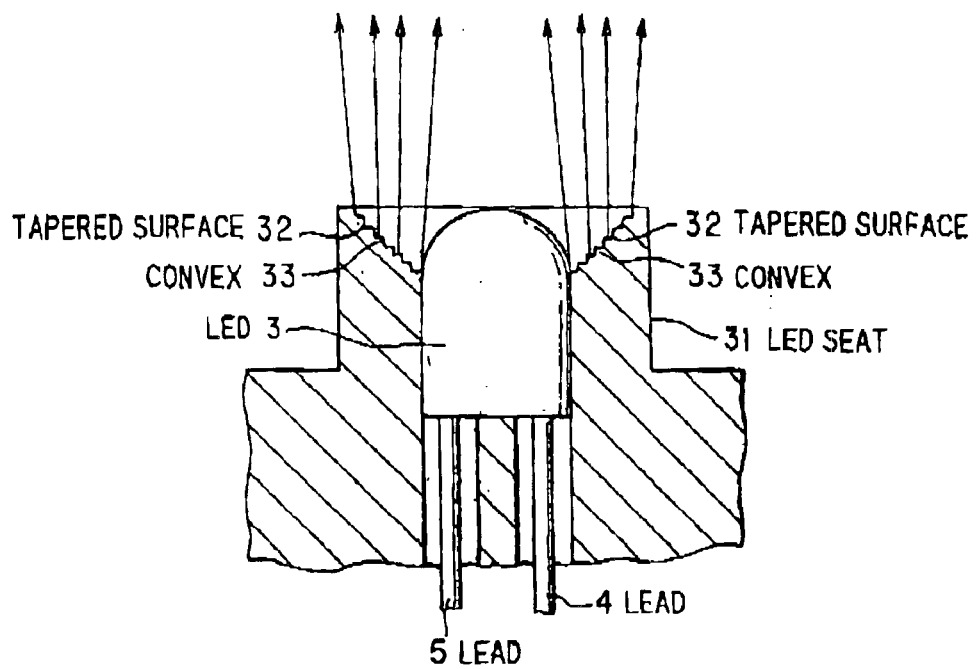
FIG. 5B is an enlarged cross-sectional view showing an LED seat in another embodiment of the invention.

The case member 30 includes an LED seat 31. This LED seat 31 is cylindrical, and the inner diameter of the cylinder is substantially identical to the outer diameter of the head of the LED 3. That is, the LED seat 31 is a cylindrical member in a form which is substantially identical to the sectional configuration of the LED 3. Therefore, the LED 3 can be inserted and fitted into the LED seat 31 substantially without leaving clearance. By virtue of this, the entry of refuse or dust into the LED lamp apparatus 1 can be prevented. The upper end of the inner surface of the LED seat 31 has been diametrically expanded in a taper form and has flat surface. By means of this tapered surface 32, the angle of radiation of light emitted from the LED 3 can be specified as illustrated by the arrows in FIG. 5A. On the tapered surface 32, preferably, a large number of convexes 33 may be provided as shown in FIG. 5B. The convexes 33 may be, for example, in a circular form provided by chamfering the top. The convexes 33 may be formed by etching the tapered surface 32 by a mixture of sand with beads. The provision of the large number of convexes 33 in the tapered surface 32 is advantageous in that light emitted from the LED 3 is irregularly reflected from the large number of convexes 33 on the tapered surface 32 as illustrated by the arrows in FIG. 5B to render light emitted from the LED lamp apparatus more homogeneous and thus to eliminate the unevenness of light.

In the case member 30, likewise, a seat 35 for the register 8 is provided.

As shown in FIG. 2D, the cover member 40 is a member which is in a substantially H-shaped configuration in vertical section. This cover member 40 is externally mounted on the case member 30 to cover the terminals 17, 18 and the register 8. A small-diameter portion 41 in the cover member 40 is inserted into or engaged with the mounting seat on the body side of a vehicle.

The molding material for the cover member 40 is preferably identical to or of the same type as the molding material for the case member 30. The molding material, however, is not particularly limited. That is, any of PP, PE, ABS and other general-purpose resins, biodegradable resins (bioplastics), such as polylactic acid, ceramics, etc. may be used as the molding material for the cover member 40.

When the LED lamp apparatus 1 is mounted, for example, on the seat for a vehicle, the terminals 17, 18 are connected to electric wiring on the vehicle side. In this case, the LED lamp apparatus 1 is controlled by a controller in the vehicle.

For example, when the LED lamp apparatus 1 is used as a room light, ON/OFF and brightness during ON state of the LED 3 are controlled, for example, in response to opening/closing of the door.

In the above embodiment, the LED lamp apparatus is provided with only one LED. Alternatively, a plurality of LEDs may be provided in the LED lamp apparatus. In this case, it is a matter of course that the plurality of LEDs can be controlled independently of each other or one another by increasing the number of metal plates constituting the circuit member.

Figure 6:
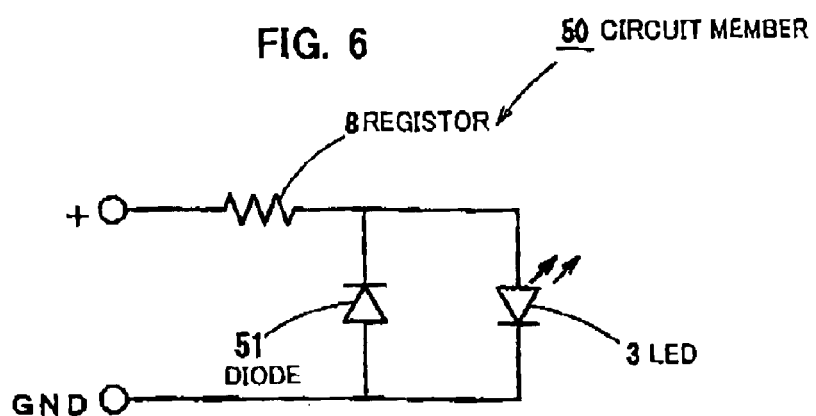
FIG. 6 is a circuit diagram showing a circuit member in another embodiment.
Figure 7:
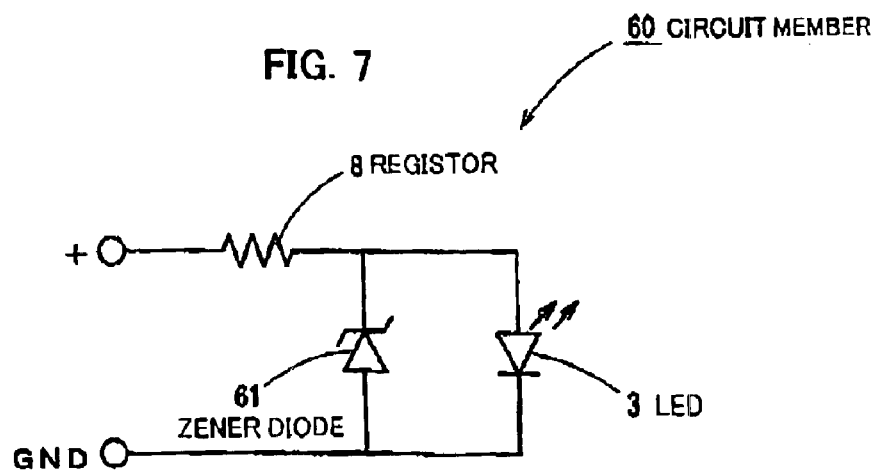
FIG. 7 is a circuit diagram showing a circuit member in still another embodiment.
Figure 8:
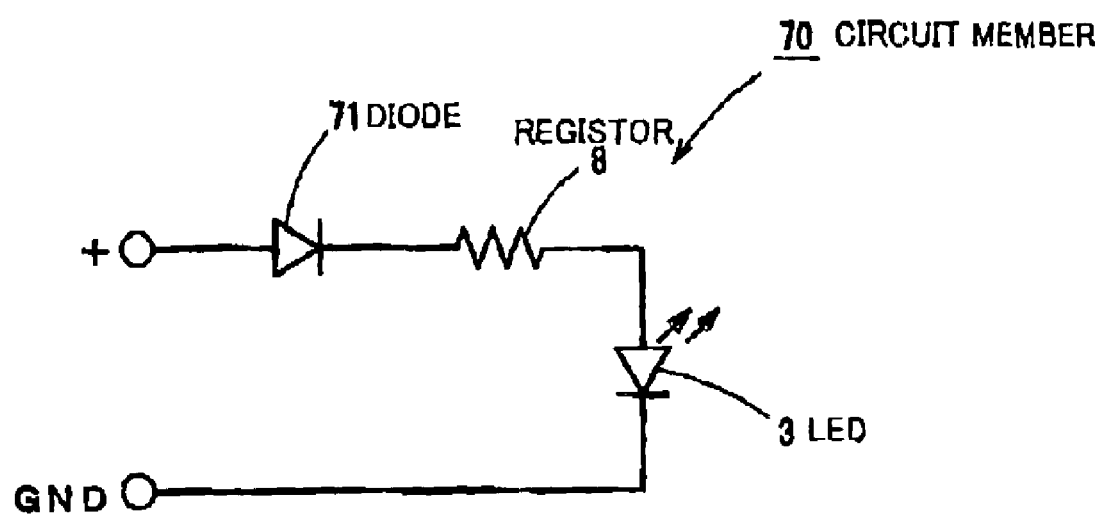
FIG. 8 is a circuit diagram showing a circuit member in a further embodiment.

FIGS. 6 to 8 show circuit members 50, 60, and 70 in another embodiment. In FIG. 4 and FIGS. 6 to 8, like members are identified with the same reference numerals, and the overlapped explanation will be omitted.

In the circuit member 50 shown in FIG. 6, a diode 51 is provided as a rectifying element in parallel to the LED 3 to protect the LED 3 from high voltage applied in the reverse direction, In the circuit member 60 shown in FIG. 7, a Zener diode 61 is provided as a rectifying element in parallel to the LED 3 to protect the LED 3 from high voltage applied in the reverse direction.

In the circuit member 60 shown in FIG. 8, a diode 71 is provided as a rectifying element before and in series with the register 8 to protect the whole circuit member from the reverse voltage.

This invention is not limited to the above embodiments and explanation thereof, and variations and modifications can be effected within the scope which does not depart from the description in the claims and can be easily conceived by a person having ordinary skill in the art.

What is claimed is:

1. A light-emitting diode (LED) lamp apparatus, comprising:
    an LED;
    a circuit member, and
    a case member, said case member including an LED seat for holding said LED,
    wherein said circuit member includes metal plates embedded in said case member, said metal plates including LED connection members that are exposed and extend beyond said case member and are disposed directly beneath said LED, said LED connection members being electrically connected respectively to leads of said LED, and wherein said LED seat comprises an inner tapered surface surrounding said LED at its upper end, the inner tapered surface being extended upwardly.

2. The LED lamp apparatus according to claim 1, wherein said LED seat is cylindrical and substantially identical to a sectional configuration of said LED and said LED is inserted into said LED seat.

3. The LED lamp apparatus according to claim 1, wherein said case member includes a seat into which a circuit element is inserted, said metal plates include circuit element connection members that extend beyond said case member, and said circuit element connection members are electrically connected respectively to leads said circuit element.

4. The LED lamp apparatus according to claim 3, wherein a plurality of convexes are provided on said tapered surface.

5. The LED lamp apparatus according to claim 3, wherein said circuit member includes terminals.

6. The LED lamp apparatus according to claim 5, further comprising a cover member that covers said terminals and said seat.

7. The LED lamp apparatus according to claim 1, wherein each of said LED connection members electrically connects respectively to said leads of said LED.

8. The LED lamp apparatus according to claim 1, wherein said LED connection members comprise plates that extend perpendicularly beyond said bottom surface of said case member.

9. The LED lamp apparatus according to claim 8, wherein said plates of said LED connection members are parallelly oriented.

10. A light-emitting diode (LED) lamp apparatus, comprising:
   an LED including leads;
   a case member, said case member comprising an LED seat for holding said LED; and
   a circuit member comprising a metal plate,
   wherein said circuit member includes first lead connection members that are exposed and disposed directly beneath said LED and to which said leads of said LED are connected, second lead connection members to which leads of an electrical element are connected, and terminals that are connected to an outer circuit,
   wherein said LED seat comprises an inner tapered surface surrounding said LED at its upper end, the inner tapered surface being extended upwardly, and
   wherein said first lead connection members radiate heat from said LED.

11. The LED lamp apparatus according to claim 10, wherein said leads of said LED and said leads of said electrical element are respectively resistance welded to said first lead connection members and said second lead connection members.

12. The LED lamp apparatus according to claim 10, wherein said leads of said LED and said leads of said electrical element are respectively soldered to said first lead connection members and said second lead connection members.

13. The LED lamp apparatus according to claim 10, wherein said electrical element comprises a resistor.

14. A light-emitting diode (LED) lamp apparatus, comprising:
   an LED including leads;
   a case member, said case member comprising an LED seat for holding said LED; and
   a circuit member embedded in a case member,
   wherein said circuit member includes LED connection members, which extend beyond said case member and are disposed directly beneath said LED, and
   wherein said LED seat comprises an inner tapered surface surrounding said LED at its upper end, the inner tapered surface being extended upwardly.

15. The LED lamp apparatus according to claim 14, wherein each of said LED connection members electrically connects respectively to said leads of said LED.

16. The LED lamp apparatus according to claim 14, wherein said LED seat is substantially identical to a sectional configuration of said LED.

17. The LED lamp apparatus according to claim 14, wherein said case member includes a seat for said circuit element including leads.

18. The LED lamp apparatus according to claim 14, wherein said circuit member further includes circuit element connection members, which extend beyond said case member and are disposed beneath said circuit element.

19. The LED lamp apparatus according to claim 14, wherein each of said circuit element connection members electrically connects respectively to said leads of said circuit element.

20. The LED lamp apparatus according to claim 14, wherein at least one of a resistor, a diode, and a Zener diode are electrically connected to said LED by said circuit member.

21. A light-emitting diode (LED) lamp apparatus, comprising:
   an LED;
   a circuit member; and
   a case member, said case member including an LED seat for holding said LED,
   wherein said circuit member includes metal plates embedded in said case member, said metal plates including LED connection members that are exposed and, extend beyond said case member to dissipate heat, said LED connection members and corresponding leads of said LED including a weld portion that electrically connects said LED connection members and said corresponding leads, and
   wherein said LED seat comprises an inner tapered surface surrounding said LED at its upper end, the inner tapered surface being extended upwardly.

22. The LED lamp apparatus according to claim 21, wherein said LED connection members are disposed directly beneath said LED.

23. A light-emitting diode (LED) lamp apparatus, comprising:
   an LED including leads;
   a case member, said case member comprising an LED seat for holding said LED; and
   a circuit member comprising a metal plate,
   wherein said circuit member includes:
      first lead connection members that are exposed, in which first weld portions connect said first lead connection members and said leads,
      second lead connection members, in which second weld portions connect said second lead connection members and said leads; and
      terminals that are connected to an outer circuit.
   wherein said first lead connection members radiate heat from said LED, and
   wherein said LED seat comprises an inner tapered surface surrounding said LED at its upper end, the inner tapered surface being extended upwardly.

24. The LED lamp apparatus according to claim 23, wherein said first lead connection members extend beyond said case member and are disposed directly beneath said LED.

25. A light-emitting diode (LED) lamp apparatus, comprising:
- an LED including leads;
- a case member said case member comprising an LED seat for holding said LED; and
- a circuit member embedded in a case member,
- wherein said circuit member includes LED connection members, which extend beyond said case member, and said LED connection members and said leads include weld portions that connect said LED connection members and said leads, and
- wherein said LED seat comprises an inner tapered surface surrounding said LED at its upper end, the inner tapered surface being extended upwardly.

26. The LED lamp apparatus according to claim 25, wherein said LED connection members are disposed directly beneath said LED.

* * * * *